US012728478B2

(12) United States Patent
Tanabe et al.

(10) Patent No.: US 12,728,478 B2
(45) Date of Patent: Sep. 8, 2026

(54) WIRE BONDING APPARATUS AND CONTROL METHOD

(71) Applicants: KABUSHIKI KAISHA TOSHIBA, Tokyo (JP); Kioxia Corporation, Tokyo (JP)

(72) Inventors: Masatoshi Tanabe, Yokohama (JP); Takashi Ito, Fujisawa (JP); Takahiro Aizawa, Yokohama (JP); Akira Tojo, Naka (JP); Yasunari Ukita, Kamakura (JP)

(73) Assignees: KABUSHIKI KAISHA TOSHIBA, Tokyo (JP); Kioxia Corporation, Tokyo (JP)

( * ) Notice: Subject to any disclaimer, the term of this patent is extended or adjusted under 35 U.S.C. 154(b) by 0 days.

(21) Appl. No.: 19/079,924

(22) Filed: Mar. 14, 2025

(65) Prior Publication Data

US 2025/0300122 A1 Sep. 25, 2025

(30) Foreign Application Priority Data

Mar. 21, 2024 (JP) ................................ 2024-045069

(51) Int. Cl.

| | |
|---|---|
| ***B23K 20/00*** | (2006.01) |
| ***B23K 20/10*** | (2006.01) |
| ***B23K 20/26*** | (2006.01) |
| *B23K 101/40* | (2006.01) |
| *H10W 72/00* | (2026.01) |

(52) U.S. Cl.

CPC ............ *B23K 20/26* (2013.01); *B23K 20/005* (2013.01); *B23K 20/007* (2013.01); *B23K 20/10* (2013.01); *B23K 2101/40* (2018.08); *H10W 72/07141* (2026.01); *H10W 72/07183* (2026.01)

(58) Field of Classification Search

CPC ............ B23K 20/26; B23K 20/10–106; B23K 2101/36–42; B23K 20/007; B23K 20/004; B23K 20/005; H10W 72/07141; H10W 72/07183; H10W 72/075; H10W 72/50

USPC ...................................... 228/180.5, 4.5, 904

See application file for complete search history.

(56) References Cited

U.S. PATENT DOCUMENTS

| | | | | |
|---|---|---|---|---|
| 6,028,673 A * | 2/2000 | Nagasaki | ............. | B23K 3/0623 250/559.23 |
| 2006/0054662 A1* | 3/2006 | Nishimaki | ........... | B23K 20/007 228/103 |
| 2006/0079008 A1* | 4/2006 | Nishimaki | ........... | B23K 20/007 438/11 |

(Continued)

FOREIGN PATENT DOCUMENTS

| | | | |
|---|---|---|---|
| CN | 103814433 A * | 5/2014 | ............. H10P 74/00 |
| JP | 6-5650 A | 1/1994 | |

(Continued)

*Primary Examiner* — Kiley S Stoner

(74) *Attorney, Agent, or Firm* — Oblon, McClelland, Maier & Neustadt, L.L.P.

(57) ABSTRACT

According to one embodiment, a controller of a wire bonding apparatus is configured to calculate a height of a bump based on a diameter of a ball-shaped portion detected by a diameter detecting part, a first position of a bonding tool detected by a position detecting part when a load sensor detects a load at a first bonding point, and a second position of the bonding tool when the bonding tool is lowered at the first bonding point, and to bond a wire based on the calculated height of the bump.

14 Claims, 7 Drawing Sheets

(56) References Cited

U.S. PATENT DOCUMENTS

| | | | | |
|---|---|---|---|---|
| 2011/0146408 | A1 | 6/2011 | Aoyagi et al. | |
| 2019/0287941 | A1* | 9/2019 | Maruya | B23K 20/007 |
| 2022/0005781 | A1* | 1/2022 | Amano | H10W 70/457 |
| 2024/0055388 | A1* | 2/2024 | Tanaka | H10W 72/0711 |
| 2024/0222302 | A1* | 7/2024 | Kotler | B23K 1/0056 |
| 2025/0300122 | A1* | 9/2025 | Tanabe | B23K 20/10 |
| 2025/0300123 | A1* | 9/2025 | Tanabe | B23K 20/10 |

FOREIGN PATENT DOCUMENTS

| | | | | | |
|---|---|---|---|---|---|
| JP | 10-116832 | A | | 5/1998 | |
| JP | 11-97477 | A | | 4/1999 | |
| JP | 11-345832 | A | | 12/1999 | |
| JP | 2006071450 | A | * | 3/2006 | B23K 20/007 |
| JP | 3775924 | B2 | | 5/2006 | |
| JP | 2006237075 | A | * | 9/2006 | H10W 72/0711 |
| JP | 2006292647 | A | * | 10/2006 | H10W 72/0711 |
| JP | 2009194136 | A | * | 8/2009 | H10W 72/019 |
| JP | 2010-27699 | A | | 2/2010 | |
| JP | 2013-225637 | A | | 10/2013 | |
| JP | WO2018/038113 | A1 | | 3/2018 | |
| JP | 6715402 | B2 | | 7/2020 | |
| KR | 20000001920 | A | * | 1/2000 | H10W 72/075 |
| KR | 20070116967 | A | * | 12/2007 | H05K 3/3452 |
| KR | 20110108603 | A | * | 10/2011 | H10W 72/0711 |
| WO | WO-2011037869 | A2 | * | 3/2011 | B23K 20/007 |

* cited by examiner

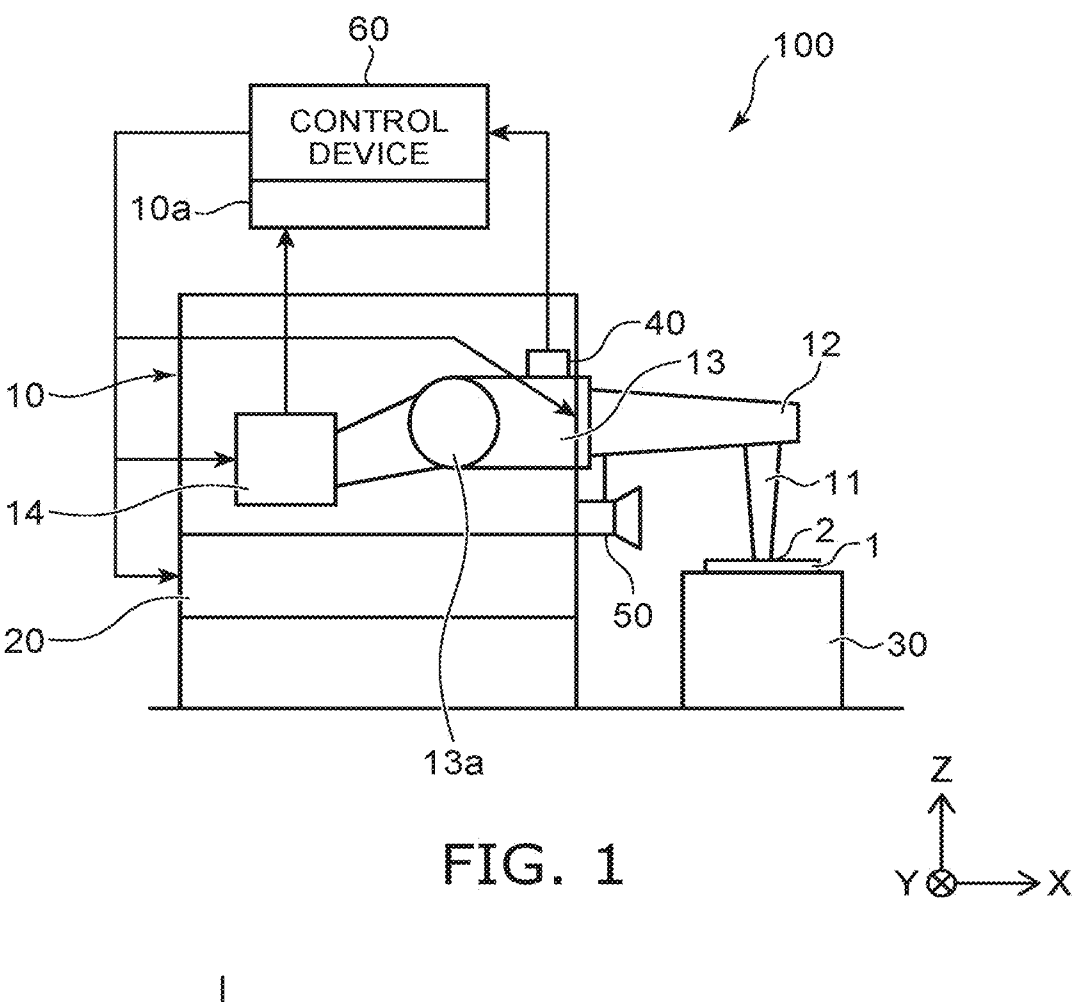
FIG. 1
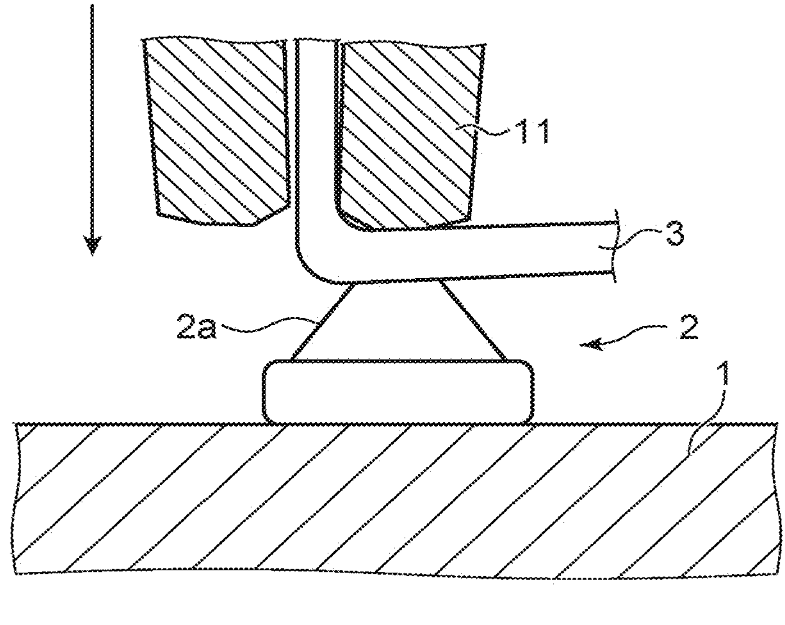
FIG. 2
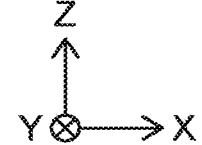

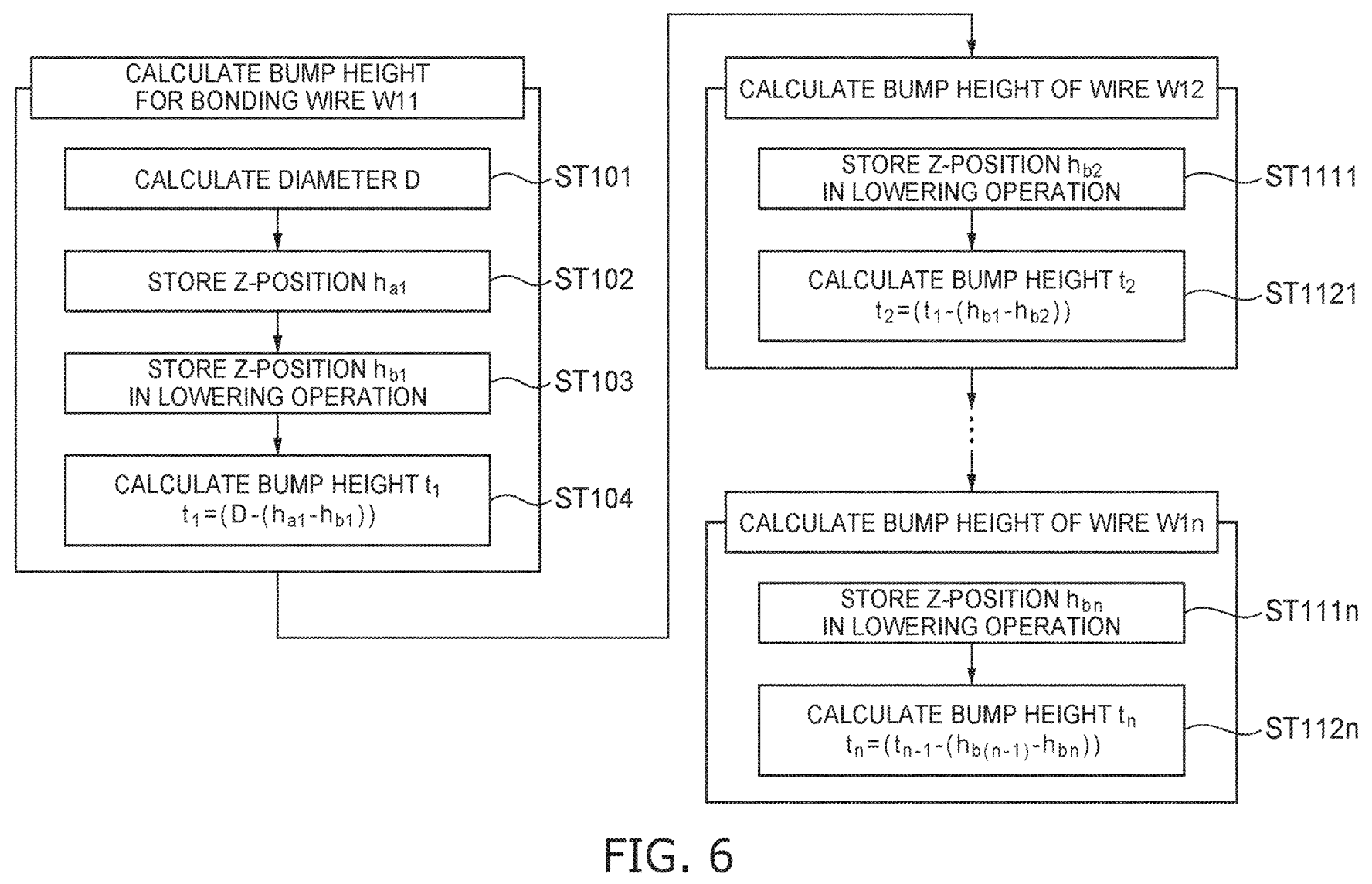

CALCULATE BUMP HEIGHT FOR BONDING WIRE W11

CALCULATE DIAMETER D — ST101

STORE Z-POSITION $h_{a1}$ — ST102

STORE Z-POSITION $h_{b1}$ IN LOWERING OPERATION — ST103

CALCULATE BUMP HEIGHT $t_1$ $t_1=(D-(h_{a1}-h_{b1}))$ — ST104

CALCULATE BUMP HEIGHT OF WIRE W12

STORE Z-POSITION $h_{b2}$ IN LOWERING OPERATION — ST1111

CALCULATE BUMP HEIGHT $t_2$ $t_2=(t_1-(h_{b1}-h_{b2}))$ — ST1121

...

CALCULATE BUMP HEIGHT OF WIRE W1n

STORE Z-POSITION $h_{bn}$ IN LOWERING OPERATION — ST111n

CALCULATE BUMP HEIGHT $t_n$ $t_n=(t_{n-1}-(h_{b(n-1)}-h_{bn}))$ — ST112n

FIG. 6

WIRE BONDING APPARATUS AND CONTROL METHOD

CROSS-REFERENCE TO RELATED APPLICATIONS

This application is based upon and claims the benefit of priority from Japanese Patent Application No. 2024-045069, filed on Mar. 21, 2024; the entire contents of which are incorporated herein by reference.

FIELD

Embodiments of the invention relate generally to a wire bonding apparatus and a control method.

BACKGROUND

Technology is known where bump heights at bonding coordinates of an electronic component are calculated based on flatness data. Bumps are then formed on the electronic component by wire bonding according to the calculated heights, and these bumps are bonded to the corresponding electrodes on a substrate.

BRIEF DESCRIPTION OF THE DRAWINGS

FIG. 1 is a schematic view illustrating an example of a wire bonding apparatus according to a first embodiment;

FIG. 2 is a schematic view schematically showing a portion of the wire bonding apparatus according to the first embodiment;

FIG. 6 is a flowchart showing an example of the processing of calculating the bump height;

DETAILED DESCRIPTION

Figure 3:
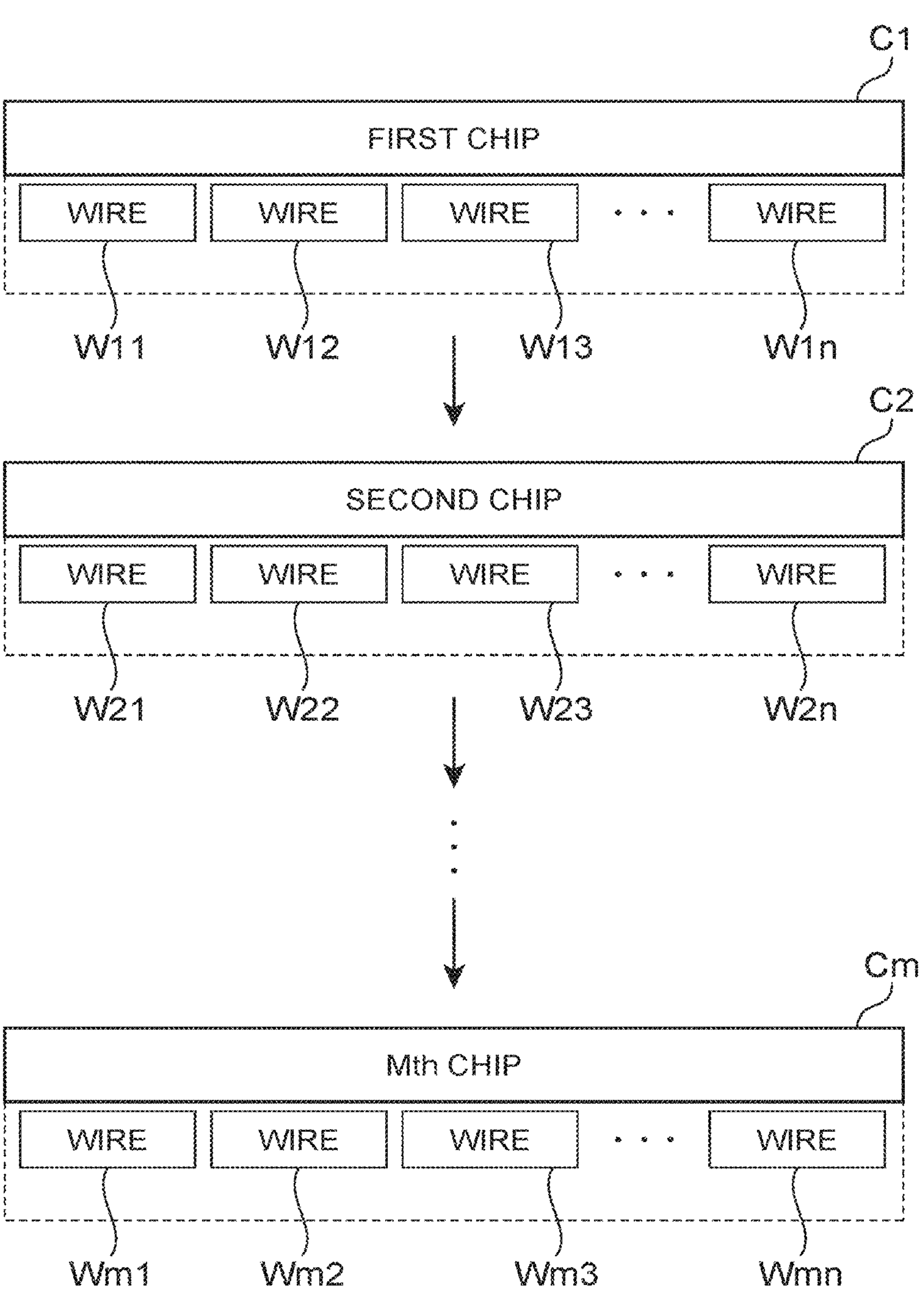
FIG. 3 is a drawing for describing the flow of wires being bonded.

According to one embodiment, a wire bonding apparatus is configured to bond a wire to a first bonding point and to a second bonding point by generating an ultrasonic vibration in a state in which the wire is pressed onto the first bonding point and by generating an ultrasonic vibration in a state in which the wire is pressed onto the second bonding point. The wire bonding apparatus includes a bonding tool, an ultrasonic horn, a load sensor, a position detecting part, a diameter detecting part, and a controller. The ultrasonic horn is configured to generate an ultrasonic vibration. The load sensor is configured to detect a load applied from the bonding tool to the first bonding point or to the second bonding point. The position detecting part is configured to detect a position in a vertical direction of the bonding tool. The diameter detecting part is configured to detect a diameter of a ball-shaped portion formed at a tip of the bonding tool at the first bonding point. The controller is configured to calculate a height of a bump and to bond the wire based on the calculated height of the bump. The height of the bump is calculated based on the diameter of the ball-shaped portion detected by the diameter detecting part, a first position of the bonding tool detected by the position detecting part when the load sensor detects a load at the first bonding point, and a second position of the bonding tool when the bonding tool is lowered most at the first bonding point.

Embodiments of the invention will now be described with reference to the drawings.

The drawings are schematic or conceptual; and the relationships between the thicknesses and widths of portions, the proportions of sizes between portions, etc., are not necessarily the same as the actual values thereof. The dimensions and/or the proportions may be illustrated differently between the drawings, even in the case where the same portion is illustrated.

In the drawings and the specification of the application, components similar to those described in regard to a drawing thereinabove are marked with like reference numerals, and a detailed description is omitted as appropriate.

First Embodiment

FIG. 1 is a schematic view illustrating a wire bonding apparatus according to an embodiment.

FIG. 2 is a schematic view illustrating a portion of the wire bonding apparatus according to the embodiment.

As shown in FIGS. 1 and 2, the wire bonding apparatus 100 according to the embodiment includes a bonding head 10, a position detecting part 10*a*, an X-Y stage 20, a bonding stage 30, a load sensor 40, a camera device 50, and a controller 60.

The bonding head 10 includes a bonding tool 11, an ultrasonic horn 12, a bonding arm 13, and a driver 14.

The bonding tool 11 feeds a wire 3, which is a bonding material. The bonding tool 11 is, for example, a bonding capillary. The wire 3 is, for example, an aluminum wire, a gold wire, a silver wire, a copper wire, etc. The bonding tool 11 causes the wire 3 to contact a bonding portion 2 of a workpiece 1 placed on the bonding stage 30, and applies a load to the bonding portion 2. According to the embodiment, the bonding portions 2 are a first bonding point P1 and a second bonding point P2 described below.

The position detecting part 10*a* detects the Z-direction position of the bonding tool 11. For example, an origin is defined at a prescribed position; and the position detecting part 10*a* detects the vertical-direction position of the bonding tool 11 from the origin. The position detecting part 10*a* is communicably connected with the controller 60.

The ultrasonic horn 12 generates an ultrasonic vibration. The ultrasonic horn 12 includes an ultrasonic vibrator that generates the ultrasonic vibration. The ultrasonic horn 12 supports the bonding tool 11. The ultrasonic vibration that is generated from the ultrasonic horn 12 is conducted to the wire 3 via the bonding tool 11. The wire 3 is bonded to the bonding portion 2 by the ultrasonic vibration transmitted to the wire 3 while it is in contact with the bonding portion 2. The ultrasonic horn 12 is electrically connected with the controller 60.

The bonding arm 13 supports the ultrasonic horn 12. That is, the bonding arm 13 supports the bonding tool 11 via the ultrasonic horn 12. The bonding arm 13 is provided rotatably around an axis part 13*a*.

The driver 14 drives the bonding arm 13 in the Z-direction with the axis part 13*a* as the center. The driver 14 is, for example, a linear motor. The bonding tool 11 and the ultrasonic horn 12 that are supported by the bonding arm 13 are moved in the Z-direction by moving the bonding arm 13 in the Z-direction. By moving the bonding tool 11 in the Z-direction, the wire 3 can contact the first and second bonding points P1 and P2 described below. This allows the bonding tool 11 to apply the load. The driver 14 is communicably connected with the controller 60.

In this specification, the direction that connects the bonding tool 11 and the workpiece 1 is taken as the Z-direction. A direction orthogonal to the Z-direction is taken as an X-direction. A direction orthogonal to the Z-direction and X-direction is taken as a Y-direction.

The bonding head 10 is mounted to the X-Y stage 20. The X-Y stage 20 is movable in the X-direction and Y-direction. The bonding head 10 is moved in the X-direction and Y-direction by moving the X-Y stage 20 in the X-direction and Y-direction. That is, the X-Y stage 20 functions as a positioning part for positioning the bonding tool 11, etc., located in the bonding head 10 in the X-direction and Y-direction. The X-Y stage 20 is communicably connected with the controller 60.

The bonding stage 30 supports the workpiece 1, which is the object of the wire bonding. For example, the bonding stage 30 supports the workpiece 1 by suction. The workpiece 1 is, for example, a substrate or a semiconductor chip such as an IC chip, etc.

The load sensor 40 continuously detects the load applied from the bonding tool 11 to the bonding portion 2 of the workpiece 1. The load sensor 40 includes, for example, a strain gauge. The load sensor 40 may detect the load applied to the tip of the bonding tool 11 at the workpiece 1 side. In the example, the load sensor 40 is mounted to the bonding arm 13. The load sensor 40 is communicably connected with the controller 60. The load sensor 40 outputs the data of the detected load to the controller 60.

For example, based on an instruction of the controller 60, the camera device 50 images a ball-shaped portion (described below) formed at the tip of the bonding tool 11 on the first bonding point P1 (described below). The camera device 50 is communicably connected with the controller 60. Image data including an image that is imaged by the camera device 50 is transmitted to the controller 60.

The controller 60 controls operations of the ultrasonic horn 12, the driver 14, and the X-Y stage 20. The controller 60 can control the output of the ultrasonic vibration generated from the ultrasonic horn 12 by controlling the ultrasonic horn 12.

The controller 60 can control the operation of the bonding tool 11 by controlling the operation of the driver 14. More specifically, the controller 60 can control the Z-direction position of the bonding tool 11 by driving the bonding arm 13 in the Z-direction by controlling the driver 14. As a result, the controller 60 can control the magnitude of the load applied from the bonding tool 11 to the bonding portion 2.

The position detecting part 10*a* acquires the Z-direction position of the bonding tool 11 driven by the driver 14. The position detecting part 10*a* may be included in the controller 60. For example, the position detecting part 10*a* includes an encoder. When a motor of the driver 14 is operated, the position detecting part 10*a* detects the rotational direction and the rotational position of the motor. The position detecting part 10*a* calculates the Z-direction position of the bonding tool 11 based on the detected rotational direction and position.

The controller 60 can control the operation of the bonding tool 11 by controlling the operation of the X-Y stage 20. More specifically, the controller 60 can control the positions in the X-direction and Y-direction of the bonding tool 11 by driving the bonding head 10 in the X-direction and Y-direction by controlling the X-Y stage 20.

As described below in detail, the controller 60 calculates a bump height $t_1$ based on three factors. The first factor is the diameter of the ball-shaped portion BO, detected by the camera device 50. The second factor is the Z-position (a first position) in the Z-direction of the bonding tool, detected by the position detecting part 10*a* when the load sensor 40 detects a load at the first bonding point P1. The third factor is the Z-position (a second position) in the Z-direction of the bonding tool 11 when it is lowered at the first bonding point P1. Using the calculated bump height $t_1$, the controller 60 bonds the wire 3.

A bump 2*a* is formed at the bonding portion 2 of the workpiece 1 placed on the bonding stage 30. The wire 3 is bonded to the bump 2*a*. The wire bonding apparatus 100 forms the bump 2*a*, bonds the wire 3 to the bump 2*a*, etc. For example, as shown in FIG. 2, the wire bonding apparatus 100 bonds the wire 3 to the bonding portion 2 by generating an ultrasonic vibration from the ultrasonic horn 12 in a state in which the wire 3 is fed from the bonding tool 11 and pressed onto the bonding portion 2.

FIG. 3 is a diagram illustrating the sequence of bonding the wires 3. A case will now be described where the workpiece 1 is taken to be an IC chip (hereinbelow, called a "chip"). The processing of bonding the wires 3 is performed in order, such as a first chip C1, a second chip C2, . . . , an Mth chip Cm (m being a natural number). In each chip, for example, in the first chip C1, multiple wires W11, W12, . . . , W1*n* (n being a natural number) are bonded to the bonding portions 2 in order. Then, in the second chip C2, the multiple wires 3 are bonded to the bonding portions 2 in order. Thus, the wires within a chip are bonded in order for each chip.

Figures 4A, 4B, 4C:
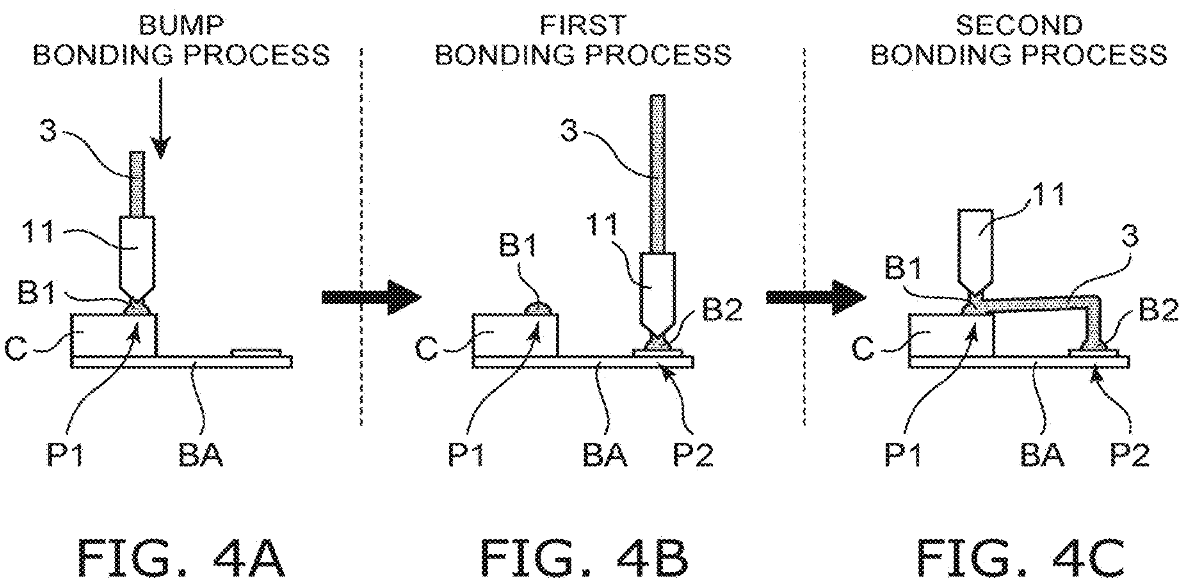
FIGS. 4A to 4C show an example of a wire bonding process.

The process of bonding the wire 3 will now be described. FIGS. 4A to 4C show an example of a wire bonding process.

As shown in FIGS. 4A to 4C, the wire bonding process includes the three processes of a bump bonding process (FIG. 4A), a first bonding process (FIG. 4B), and a second bonding process (FIG. 4C). A chip C is located on a substrate BA. The first bonding point P1 is on the chip C; and the second bonding point P2 is on the substrate BA. The wire 3 is bonded to bumps formed at the first and second bonding points P1 and P2.

First, as shown in FIG. 4A, the bump bonding process is performed. A bump B1 is formed at the first bonding point P1. The bonding tool 11 is positioned on the first bonding point P1 of the chip C. The wire 3 extends through the bonding tool 11. The tip of the wire 3 is positioned at the first bonding point P1 on the chip C; and a load is applied to the wire 3. The tip portion of the wire 3 is formed into a bump shape on the chip C; the wire is cut by an ultrasonic wave; and the bump B1 is formed on the chip C. Then, the bonding tool 11 is moved from the first bonding point P1 to the second bonding point P2.

Then, as shown in FIG. 4B, the first bonding process is performed. In the state in which the bump B1 is formed on the chip C, a bump B2 is formed on the second bonding point P2 by the tip of the wire 3 being pressed onto the substrate BA by operating the bonding tool 11.

Continuing as shown in FIG. 4C, the second bonding process is performed. In the state in which the bump B2 is formed, the bonding tool 11 moves a prescribed Z-direction distance, and then the bonding tool 11 bends the wire 3 and moves from the second bonding point P2 to the first bonding point P1. At this time, the wire 3 continuously extending from the second bonding point P2 is bonded to the bump B1 on the chip C. Then, the wire 3 is cut by an ultrasonic vibration; and the wire 3 is bonded to the chip C and the substrate BA. Thus, wire bonding is performed. Therefore, the height of the bump B1 can be accurately calculated. By using the calculated height to control bonding conditions (such as the load or the ultrasonic wave output) when connecting the wire 3, the occurrence of wire bonding defects can be suppressed.

Figure 5:
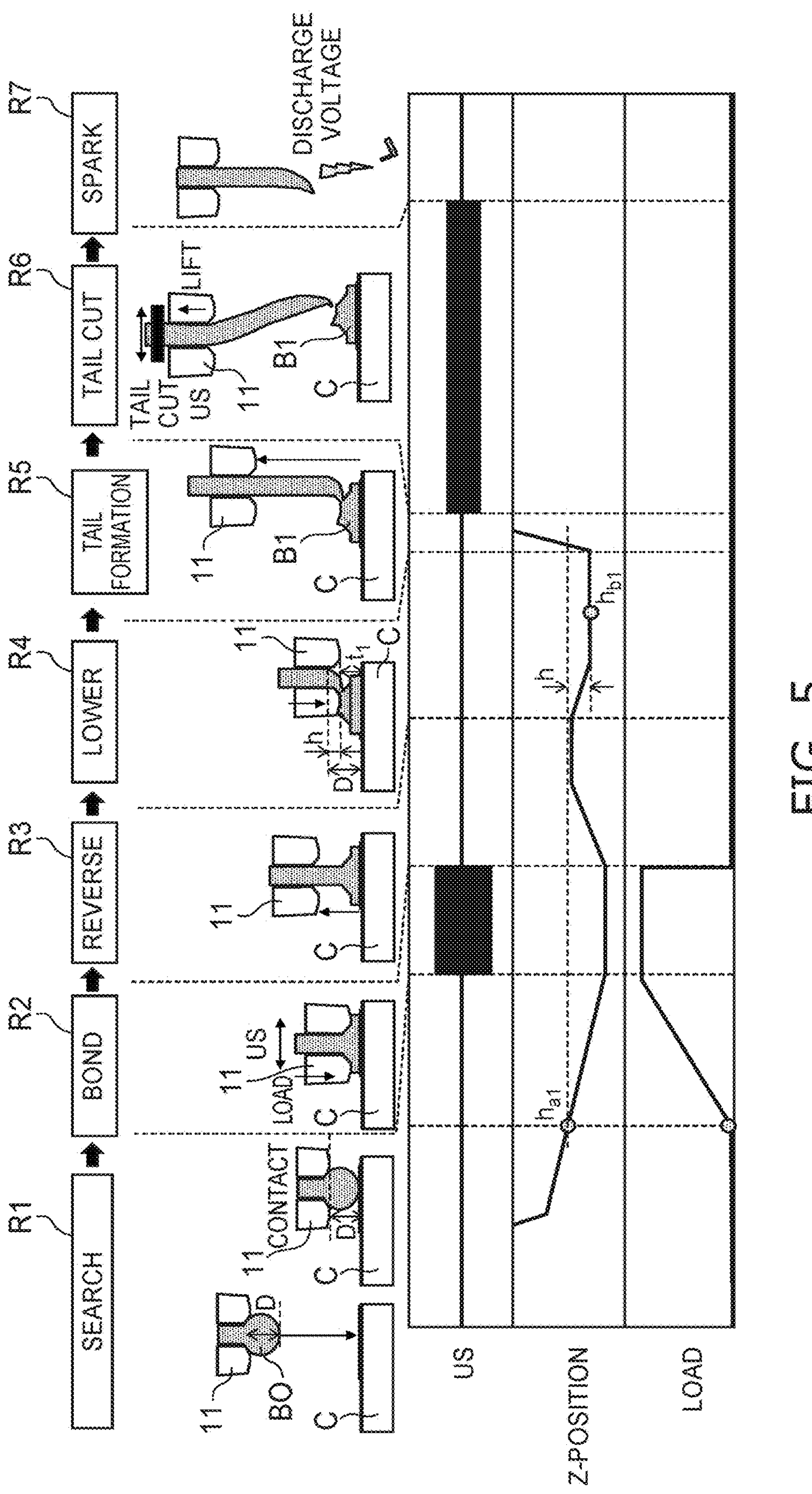
FIG. 5 is a diagram for describing an example of the process of forming the leading bump.

The process of forming the leading bump B1 on the chip C will now be described in more detail. FIG. 5 is a diagram for describing an example of the process of forming the bump B1.

According to the embodiment as shown in FIG. 5, the process of forming the bump includes a search process R1, a bonding process R2, a reverse process R3, a lowering process R4, a tail formation process R5, a tail cut process R6, and a spark process R7.

The search process R1 is a process of causing the ball-shaped portion BO formed at the tip of the wire 3 inserted through the bonding tool 11 to contact the chip C surface. The bonding process R2 is a process of mashing and bonding the ball-shaped portion BO to the chip C surface by applying a load and an ultrasonic vibration to the ball-shaped portion BO. The reverse process R3 is a process of lifting the bonding tool 11 a prescribed distance. The lowering process R4 is a process of determining the bump height by lowering the bonding tool 11 after shifting the bonding tool 11 in the X-direction. The tail formation process R5 is a process of forming a tail by lifting the bonding tool 11 to a prescribed position. The tail cut process R6 is a process of cutting the tail and the bump B1 by applying an ultrasonic vibration while lifting the bonding tool 11. Thus, the bump B1 is formed on the chip C. The subsequent spark process R7 is a process of forming the ball-shaped portion BO by melting the wire 3 by generating a spark at the tip of the wire 3.

FIG. 5 also shows the vibration state of the ultrasonic vibration (US), the Z-position of the bonding tool 11, and the detection state of the load sensor 40 corresponding to the processes R1 to R7. A Z-position $h_{a1}$ is the Z-position at the rise of the load signal detected by the load sensor 40. A Z-position $h_{b1}$ is the Z-position when the bonding tool 11 is lowered most in the lowering operation. A ball mash amount h, which is how much the ball-shaped portion BO is deformed, is represented by $h_{a1}-h_{b1}$. The bump height $t_1$ can be calculated by utilizing the Z-position $h_{a1}$ and the Z-position $h_{b1}$.

The processing of calculating the bump heights of the leading bump B11 and the second and subsequent bumps B12 to B1*n* on a single chip C will now be described. The bump heights are calculated when the controller 60 performs wire bonding. FIG. 6 is a flowchart showing an example of the processing of calculating the bump height.

First, the controller 60 detects the bump height of the bump for bonding the leading wire W11 at the first chip C1. More specifically, as shown in FIG. 6, the controller 60 calculates a diameter D of the ball-shaped portion BO based on the image data imaged by the camera device 50 (ST101). For example, the controller 60 includes an image analyzer (not illustrated); and the diameter D of the ball-shaped portion BO is calculated by the image analyzer analyzing the image data. For example, the dimension in the vertical direction of the ball-shaped portion BO is used as the diameter D. A dimension of the ball-shaped portion BO in the horizontal direction or in a direction oblique to the vertical direction may be used as the diameter D.

As shown in the search process R1 of FIG. 5, the position at which the ball-shaped portion BO is imaged may be the position at which the ball-shaped portion BO is formed, or may be a position directly before contacting the chip C after the ball-shaped portion BO is formed.

Then, the controller 60 stores the Z-position $h_{a1}$ in the Z-direction of the bonding tool 11 (ST102). According to the embodiment, the Z-position $h_{a1}$ of the bonding tool 11 when the ball-shaped portion BO contacts the upper surface of the chip C in the search process R1 described above is stored. The controller 60 may determine the presence of contact based on the detection state of the load sensor 40.

Continuing, the controller 60 stores the Z-position $h_{b1}$ in the lowering operation (ST103). The controller 60 stores the Z-position when the bonding tool 11 is lowered to the lowest position in the lowering process R4 shown in FIG. 5 as the Z-position $h_{b1}$.

Then, the controller 60 calculates the bump height $t_1$ (ST104). The bump height $t_1$ is calculated by $$t_1 = (D - h)$$

wherein D is the diameter D of the ball-shaped portion BO, and h is the ball mash amount h. Because the ball mash amount h is $h_{a1}-h_{b1}$, the formula becomes $$t_1 = (D - (h_{a1} - h_{b1})).$$

As a result, the controller 60 can determine the bump height $t_1$ of the leading bump B11.

Then, the controller 60 detects a bump height $t_2$ of the second bump B12. The bump B12 is formed at a position (a third bonding point) that is different from the position of the bump B11. More specifically, as shown in FIG. 6, the controller 60 stores the Z-position $h_{b2}$ in the lowering operation (ST1111), and calculates the bump height $t_2$ by calculating a difference $h_2$ between the Z-position $h_{b2}$ and the Z-position $h_{b1}$ of the first lowering operation (ST1112). The bump height $t_2$ is calculated by $$t_2 = t_1 - h_2$$

$$t_2 = t_1 - (h_{b1} - h_{b2}).$$

The method of calculating the bump height $t_2$ will now be described in more detail with reference to FIG. 7. The difference $h_2$ is described with reference to FIG. 7.

Figure 7:
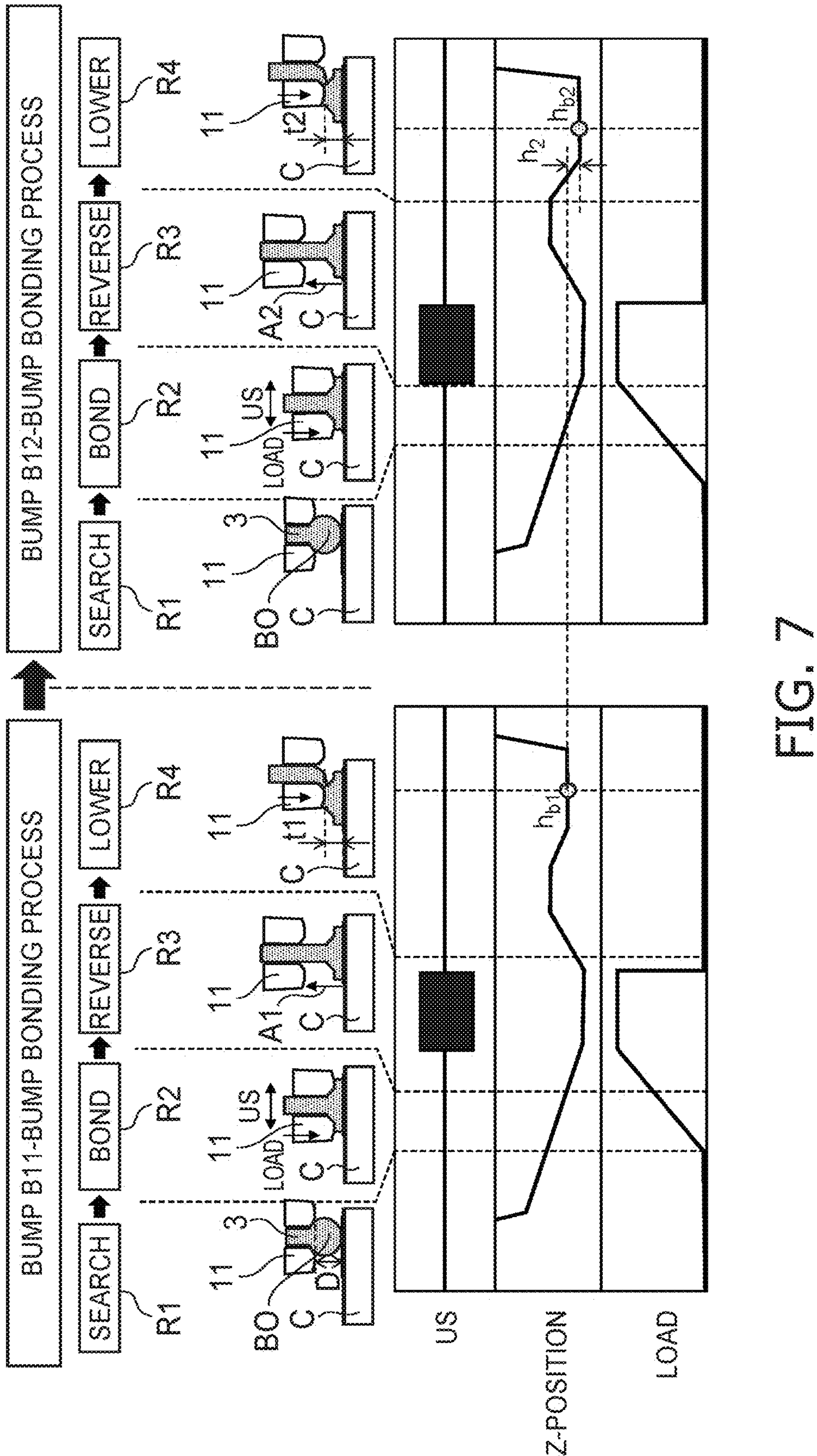
FIG. 7 is a diagram for describing an example of a method for calculating the bump height of the second bump.

FIG. 7 is a diagram for describing a method for calculating the bump height $t_2$ of the second bump.

FIG. 7 shows the processes of the search process R1, the bonding process R2, the reverse process R3, and the lowering process R4 for the bump B11 and for the bump B12. FIG. 7 also shows the vibration state of the ultrasonic vibration (US), the Z-position of the bonding tool 11, and the detection state of the load sensor 40 corresponding to the processes R1 to R4.

The bump height $t_1$ is shown in the lowering process R4 when forming the bump B11. The difference $h_2$ is the difference between the Z-position $h_{b1}$ when the bonding tool 11 is lowered most when forming the bump B11 and the Z-position $h_{b2}$ when the bonding tool 11 is lowered most when forming the bump B12. The bump height $t_2$ is shown in the lowering process R4 when forming the bump B12. The bump height $t_2$ of the bump B12 is calculated using the bump height $t_1$ and the difference $h_2$.

Similarly to the bump B12, the controller 60 stores the Z-position in the lowering operation for a third bump B13 and for subsequent bumps, e.g., the Z-position hon of the bump B1$n$ (ST111$n$). It can then calculate the bump height $t_n$ (ST112$n$) using $t_n=(t_{n-1}-(h_{b(n-1)}-h_{bn})$.

Thus, for the second and subsequent wires, the controller 60 can determine the bump height by utilizing the Z-position when forming the bump one-previous. As a result, the wire bonding apparatus 100 can use the camera device 50 to image the ball-shaped portion BO and can perform the processing of calculating the diameter D for only the leading bump B11, and so an increase of the takt time can be suppressed.

The ball mash amount and the diameter of the ball-shaped portion also can be calculated for the bump B12 and subsequent bumps.

The bumps B11 to B1$n$ are formed on one chip C, and then the multiple bumps B21 to B2$n$ are formed on, for example, the substrate BA. In other words, in the example shown in FIGS. 3, 6, and 7, multiple bump formation processes (shown in FIG. 4A) are performed for multiple points on one chip C. Then, multiple first bonding processes (shown in FIG. 4B) are performed for multiple points on the substrate BA. Subsequently, the multiple bumps B21 to B2$n$ are respectively connected to the multiple bumps B11 to B1$n$ by wires by performing multiple second bonding processes (shown in FIG. 4C).

According to the wire bonding apparatus 100 described above, the bump heights $t_1$ to $t_n$ of the bumps B11, B12, . . . , B1$n$ in the chip C can be accurately calculated. Therefore, the wire bonding apparatus 100 can accurately connect the wire 3 to the bonding portion 2. Accordingly, the wire bonding apparatus 100 can suppress the occurrence of bonding defects of the wire 3. Similarly, according to the control method of the wire bonding apparatus 100 described above, the occurrence of bonding defects of the wire 3 can be suppressed.

The wire bonding apparatus 100 can calculate the bump height $t_1$ in the bump bonding process (see FIG. 4A). The wire bonding apparatus 100 can perform the processing of bonding the wire 3 to the bonding portion 2 in the second bonding process (see FIG. 4C) based on the calculated bump height $t_1$. Even when the first and second bonding processes are performed directly after the bump bonding process, the time for performing processing between the bump bonding process and the second bonding process is, for example, about 50 ms. Therefore, the time necessary for the processing of bonding the wire 3 based on the calculated bump height $t_1$ in the second bonding process can be ensured. Also, the bump height $t_1$ can be quantified.

Second Embodiment

A second embodiment differs from the first embodiment in that processing of modifying a condition of the second bonding process based on the calculated bump height is added. Configurations similar to those of the first embodiment are marked with the same reference numerals; and a detailed description is omitted.

Figure 8:
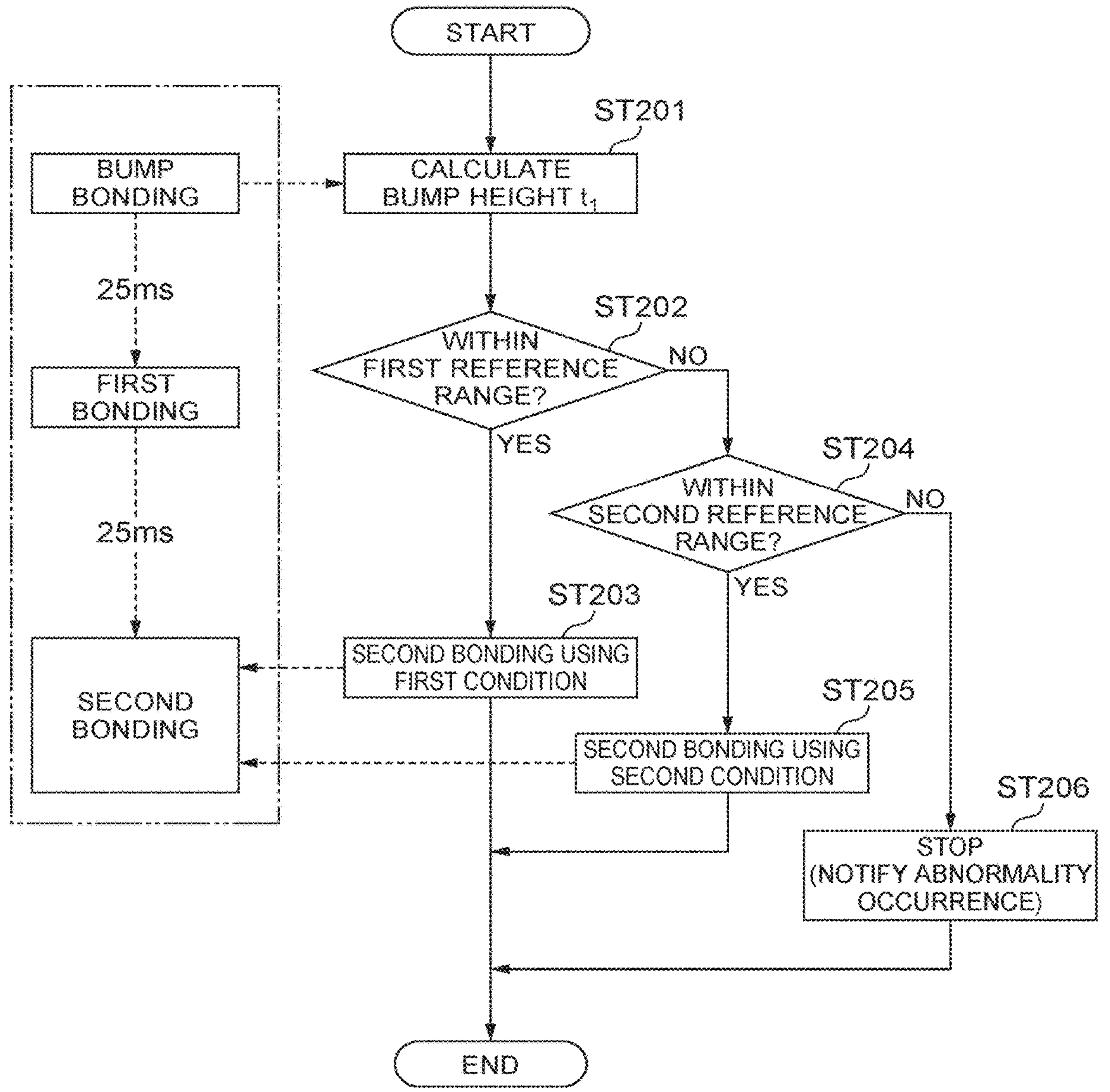
FIG. 8 shows an example of a correspondence between a flowchart showing an example of processing of modifying a condition of the second bonding process based on the bump height of the wire bonding apparatus according to a second embodiment and the bump formation process of the wire bonding apparatus.

FIG. 8 shows an example of a correspondence between a flowchart showing an example of processing of modifying a condition of the second bonding process based on the calculated bump height $t_1$ and the bump formation process of the wire bonding apparatus 100.

As shown in FIG. 8, first, the controller 60 calculates the bump height $t_1$ (ST201). The method for calculating the bump height $t_1$ of the leading bump B11 is similar to that of the first embodiment; and a description is therefore omitted.

Then, the controller 60 determines whether or not the bump height $t_1$ is within a first reference range (ST202). When the bump height $t_1$ is determined to be within the first reference range (ST202: YES), the controller 60 performs the second bonding using a first condition (ST203). For example, as bonding conditions, the load applied to the bonding tool 11 and the output of the ultrasonic horn 12 are preset.

On the other hand, when the bump height $t_1$ is determined not to be within the first reference range (ST202: NO), the controller 60 determines whether or not the bump height is within a second reference range (ST204). When the bump height $t_1$ is determined to be within the second reference range (ST204: YES), the controller 60 performs the second bonding using a second condition (ST205). The second condition is different from the first condition. For example, at least one of the load applied to the bonding tool 11 or the output of the ultrasonic horn 12 at the second condition is different from at least one of the load applied to the bonding tool 11 or the output of the ultrasonic horn 12 at the first condition.

When the bump height $t_1$ is determined not to be within the second reference range (ST204: NO), the controller 60 stops the operation of the wire bonding apparatus 100 (ST206). When stopping the operation, for example, the controller 60 may output information indicating an abnormality occurrence to a preset terminal device, etc.

The bump height $t_1$ is calculated during the bump bonding process. Then, the first bonding process is performed, for example, 25 ms later. Then, the second bonding process is performed, for example, 25 ms later. Therefore, the processing time necessary for the controller 60 to perform the second bonding process using the first condition or the second condition after calculating the bump height $t_1$ in the bump bonding process can be ensured.

According to the wire bonding apparatus 100 and the control method of the wire bonding apparatus 100, the condition of the second bonding process can be modified according to the bump height $t_1$. Also, the controller 60 of the wire bonding apparatus 100 can stop the operation of the wire bonding apparatus 100 when the bump height $t_1$ is outside the second reference range, for example, in a range in which an abnormality is detected. At this time, by notifying the abnormality occurrence, for example, a manager of the wire bonding apparatus 100 or the like can be prompted to pay attention.

Embodiments include the following forms.

Appendix 1

A wire bonding apparatus configured to bond a wire to a first bonding point and to a second bonding point by generating an ultrasonic vibration in a state in which the wire is pressed onto the first bonding point and by generating an ultrasonic vibration in a state in which the wire is pressed onto the second bonding point, the apparatus comprising:

a bonding tool;

an ultrasonic horn configured to generate an ultrasonic vibration;

a load sensor configured to detect a load applied from the bonding tool to the first bonding point or to the second bonding point;

a position detecting part configured to detect a position in a vertical direction of the bonding tool;

a diameter detecting part configured to detect a diameter of a ball-shaped portion formed at a tip of the bonding tool at the first bonding point; and a controller configured to calculate a height of a bump based on the diameter of the ball-shaped portion detected by the diameter detecting part, a first position of the bonding tool detected by the position detecting part when the load sensor detects a load at the first bonding point, and a second position of the bonding tool when the bonding tool is lowered most at the first bonding point, the controller being configured to bond the wire based on the calculated height of the bump.

Appendix 2

The apparatus according to appendix 1, wherein the controller is configured to stop bonding the wire according to the calculated height of the bump.

Appendix 3

The apparatus according to appendix 1 or 2, wherein according to the calculated height of the bump, the controller is configured to modify at least one of a load applied to the bonding tool or an ultrasonic wave output when bonding the wire.

Appendix 4

The apparatus according to any one of appendixes 1 to 3, wherein the diameter detecting part detects the diameter of the ball-shaped portion before a contact of the ball-shaped portion with the first bonding point, the position detecting part detects the first position of the bonding tool when the ball-shaped portion contacts the first bonding point and the load is detected by the load sensor, and the position detecting part detects the second position of the bonding tool when the bonding tool is lowered to a lowest position.

Appendix 5

The apparatus according to any one of appendixes 1 to 4, wherein the controller calculates a height of another bump at a third bonding point based on the calculated height of the bump, and a third position of the bonding tool when the bonding tool is lowered most at the third bonding point.

Appendix 6

The apparatus according to any one of appendixes 1 to 5, wherein when the calculated height of the bump is within a first reference range, the controller bonds, to the bump of the first bonding point by using a first condition, the wire extending from the second bonding point.

Appendix 7

The apparatus according to appendix 6, wherein when the calculated height of the bump is outside the first reference range, the controller determines whether or not the calculated height of the bump is within a second reference range, the second reference range being different from the first reference range, and when the calculated height of the bump is within the second reference range, the controller bonds the wire to the bump of the first bonding point by using a second condition, the second condition being different from the first condition.

Appendix 8

A control method of a wire bonding apparatus, the apparatus being configured to bond a wire to a first bonding point and to a second bonding point by generating an ultrasonic vibration in a state in which the wire is pressed onto the first bonding point and by generating an ultrasonic vibration in a state in which the wire is pressed onto the second bonding point, the method comprising:

detecting a diameter of a ball-shaped portion formed at a tip of a bonding tool at the first bonding point;

acquiring a first position in a vertical direction of the bonding tool at the first bonding point when a load applied from the bonding tool to the first bonding point is detected;

acquiring a second position of the bonding tool when the bonding tool is lowered most at the first bonding point;

calculating a height of a bump based on the diameter of the ball-shaped portion, the first position, and the second position; and bonding the wire based on the calculated height of the bump.

Appendix 9

The method according to appendix 8, further comprising:

stopping the bonding of the wire according to the calculated height of the bump.

Appendix 10

The method according to appendix 8 or 9, further comprising:

modifying, according to the calculated height of the bump, at least one of a load applied to the bonding tool or an ultrasonic wave output when bonding the wire.

Appendix 11

The method according to any one of appendixes 8 to 10, wherein the diameter of the ball-shaped portion is detected before a contact of the ball-shaped portion with the first bonding point, the first position of the bonding tool is detected when the ball-shaped portion contacts the first bonding point and the load applied from the bonding tool to the first bonding point is detected, and the second position of the bonding tool is detected when the bonding tool is lowered to a lowest position.

Appendix 12

The method according to any one of appendixes 8 to 11, wherein a height of another bump at the second bonding point is calculated based on the calculated height of the bump and based on a third position of the bonding tool when the bonding tool is lowered most at the second bonding point.

Appendix 13

The method according to any one of appendixes 8 to 12, further comprising:

when the calculated height of the bump is within a first reference range, bonding, to the bump of the first bonding point by using a first condition, the wire extending from the second bonding point.

Appendix 14

The method according to appendix 13, further comprising:

when the calculated height of the bump is outside the first reference range, determining whether or not the calculated height of the bump is within a second reference range, the second reference range being different from the first reference range; and when the calculated height of the bump is within the second reference range, bonding the wire to the bump of the first bonding point by using a second condition, the second condition being different from the first condition.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention. Moreover, above-mentioned embodiments can be combined mutually and can be carried out.

What is claimed is:

1. A wire bonding apparatus configured to bond a wire to a first bonding point and to a second bonding point by generating an ultrasonic vibration in a state in which the wire is pressed onto the first bonding point and by generating an ultrasonic vibration in a state in which the wire is pressed onto the second bonding point, the apparatus comprising:

a bonding tool;

an ultrasonic horn configured to generate an ultrasonic vibration;

a load sensor configured to detect a load applied from the bonding tool to the first bonding point or to the second bonding point;

a position detecting part configured to detect a position in a vertical direction of the bonding tool;

a diameter detecting part configured to detect a diameter of a ball-shaped portion formed at a tip of the bonding tool at the first bonding point; and a controller configured to calculate a height of a bump based on the diameter of the ball-shaped portion detected by the diameter detecting part, a first position of the bonding tool detected by the position detecting part when the load sensor detects a load at the first bonding point, and a second position of the bonding tool when the bonding tool is lowered most at the first bonding point, the controller being configured to bond the wire based on the calculated height of the bump.

2. The apparatus according to claim 1, wherein the controller is configured to stop bonding the wire according to the calculated height of the bump.

3. The apparatus according to claim 1, wherein according to the calculated height of the bump, the controller is configured to modify at least one of a load applied to the bonding tool or an ultrasonic wave output when bonding the wire.

4. The apparatus according to claim 1, wherein the diameter detecting part detects the diameter of the ball-shaped portion before a contact of the ball-shaped portion with the first bonding point, the position detecting part detects the first position of the bonding tool when the ball-shaped portion contacts the first bonding point and the load is detected by the load sensor, and the position detecting part detects the second position of the bonding tool when the bonding tool is lowered to a lowest position.

5. The apparatus according to claim 1, wherein the controller calculates a height of another bump at a third bonding point based on the calculated height of the bump, and a third position of the bonding tool when the bonding tool is lowered most at the third bonding point.

6. The apparatus according to claim 1, wherein when the calculated height of the bump is within a first reference range, the controller bonds, to the bump of the first bonding point by using a first condition, the wire extending from the second bonding point.

7. The apparatus according to claim 6, wherein when the calculated height of the bump is outside the first reference range, the controller determines whether or not the calculated height of the bump is within a second reference range, the second reference range being different from the first reference range, and when the calculated height of the bump is within the second reference range, the controller bonds the wire to the bump of the first bonding point by using a second condition, the second condition being different from the first condition.

8. A control method of a wire bonding apparatus, the apparatus being configured to bond a wire to a first bonding point and to a second bonding point by generating an ultrasonic vibration in a state in which the wire is pressed onto the first bonding point and by generating an ultrasonic vibration in a state in which the wire is pressed onto the second bonding point, the method comprising:

detecting a diameter of a ball-shaped portion formed at a tip of a bonding tool at the first bonding point;

acquiring a first position in a vertical direction of the bonding tool at the first bonding point when a load applied from the bonding tool to the first bonding point is detected;

acquiring a second position of the bonding tool when the bonding tool is lowered most at the first bonding point;

calculating a height of a bump based on the diameter of the ball-shaped portion, the first position, and the second position; and bonding the wire based on the calculated height of the bump.

9. The method according to claim 8, further comprising:

stopping the bonding of the wire according to the calculated height of the bump.

10. The method according to claim 8, further comprising:

modifying, according to the calculated height of the bump, at least one of a load applied to the bonding tool or an ultrasonic wave output when bonding the wire.

11. The method according to claim 8, wherein the diameter of the ball-shaped portion is detected before a contact of the ball-shaped portion with the first bonding point, the first position of the bonding tool is detected when the ball-shaped portion contacts the first bonding point and the load applied from the bonding tool to the first bonding point is detected, and the second position of the bonding tool is detected when the bonding tool is lowered to a lowest position.

12. The method according to claim 8, wherein a height of another bump at the second bonding point is calculated based on the calculated height of the bump and based on a third position of the bonding tool when the bonding tool is lowered most at the second bonding point.

13. The method according to claim 8, further comprising: when the calculated height of the bump is within a first reference range, bonding, to the bump of the first bonding point by using a first condition, the wire extending from the second bonding point.

14. The method according to claim 13, further comprising:

when the calculated height of the bump is outside the first reference range, determining whether or not the calculated height of the bump is within a second reference range, the second reference range being different from the first reference range; and when the calculated height of the bump is within the second reference range, bonding the wire to the bump of the first bonding point by using a second condition, the second condition being different from the first condition.

* * * * *